United States Patent

Muroyama et al.

[11] Patent Number: 5,578,530
[45] Date of Patent: Nov. 26, 1996

[54] MANUFACTURING METHOD OF SEMICONDUCTOR DEVICE WHICH INCLUDES FORMING A SILICON NITRIDE LAYER USING A SI, N, AND F CONTAINING COMPOUND

[75] Inventors: Masakazu Muroyama; Hideyuki Kito, both of Kanagawa, Japan

[73] Assignee: Sony Corporation, Tokyo, Japan

[21] Appl. No.: 501,738

[22] Filed: Jul. 12, 1995

[30] Foreign Application Priority Data

Jul. 12, 1994 [JP] Japan .................... 6-182899

[51] Int. Cl.$^6$ .................... H01L 21/316; H01L 21/318
[52] U.S. Cl. .................... 437/238; 437/241
[58] Field of Search .................... 437/241, 238, 437/242

[56] References Cited

U.S. PATENT DOCUMENTS

| | | | |
|---|---|---|---|
| 4,720,395 | 1/1988 | Foster | 437/241 |
| 4,726,963 | 2/1988 | Ishihara et al. | 427/39 |
| 4,992,306 | 2/1991 | Hochberg et al. | 427/255.3 |
| 5,043,224 | 8/1991 | Jaccodine et al. | 428/446 |
| 5,231,057 | 7/1993 | Ooki et al. | 437/225 |
| 5,264,396 | 11/1993 | Thakur et al. | 437/238 |

OTHER PUBLICATIONS

Billy, Michel, "Nitrogens Compounds of Silicon Formed by the Reaction of Ammonium Halides with the Imide $SiN_2H_2$", Compt. Rend., 248, 807–10 (1959).
Billy, Michel, "Preparation and Definition of a Silicon Nitride", Ann. Chim. (Paris) [13], 4, 795–851 (1959).

*Primary Examiner*—Robert Kunemund
*Assistant Examiner*—M. Whipple
*Attorney, Agent, or Firm*—Hill, Steadman & Simpson

[57] ABSTRACT

In a manufacturing method of semiconductor device having a fluorine-containing SiN layer, an SiN layer excellent in the step coverage can be formed using as raw material an Si compound containing at least both nitrogen and fluorine, by virtue of an intermediate product which, during the formation of the above SiN layer, is formed, liable to polymerization and has fluidity. Moreover, as the above Si compound contains fluorine that is taken into the formation of the fluorine-containing SiN layer whose dielectric constant is lowered thereby, delay in circuit operation due to parasitic capacitances can be reduced.

24 Claims, 4 Drawing Sheets

MANUFACTURING METHOD OF SEMICONDUCTOR DEVICE WHICH INCLUDES FORMING A SILICON NITRIDE LAYER USING A SI, N, AND F CONTAINING COMPOUND

BACKGROUND OF THE INVENTION

1. Field of the Invention

The present invention relates to a method for manufacturing a of semiconductor device having an SiN layer as an outermost protective surface layer, an interlayer insulator or the like.

2. Description of the Related Art

Because of its non-porosity and excellent moisture resistance, an SiN layer is used as a passivation layer of semiconductor device, i.e., as an outermost protective surface layer, an interlayer insulator or the like. In most cases SiN layers are formed by plasma CVD methods using as gaseous raw material either $SiH_4+NH_3$ or $SiH_4+N_2$, in order not to damage Al wirings or other structures already formed on the substrate.

FIG. 1 shows a prior art semiconductor device having an SiN layer as a passivation layer. As illustrated in FIG. 1A, an interlayer insulator 12 such as an $SiO_2$ layer or the like is formed on a semiconductor substrate 11 such as an Si substrate or the like and Al wirings 13 are patterned on the interlayer insulator 12. Subsequently, by the above-mentioned plasma CVD method, there is formed an SiN layer 14 which thus covers the Al wirings 13 as illustrated in FIG. 1B.

With an increase in the integration level of semiconductor devices, however, patterns of the Al wirings 13 have undergone further miniaturization. This gives rise to, as illustrated in FIG. 1B, a degradation in the step coverage of the SiN layer 14 and, in consequently, voids may form in the SiN layer 14 between the Al wirings 13. Accordingly, a reliable semiconductor device is not provided by the method under these circumstances.

An approach has been proposed to improve the step coverage of the SiN layer using sputter effect by an increased ion impact of low energy during the deposition of the SiN layer. In accordance with this method, a low frequency voltage is applied, to the electrode on which a semiconductor substrate is placed, and a high frequency voltage is applied to the other electrode in a parallel plate plasma CVD apparatus. By this approach, an improvement in the step coverage has been achieved but not to such an extent as to form a conformal SiN layer.

For this reason, another approach using plasma CVD methods has been proposed which includes as gaseous raw materials an organic Si compound containing nitrogen, instead of an $SiH_4$ type gaseous raw material. An SiN layer excellent in the step coverage can be formed using an organic Si compound containing nitrogen, by virtue of an intermediate product formed, during the formation of the above SiN layer, which polymerizes and exhibits fluidity.

Although SiN layer formed by plasma CVD methods using an organic Si compound containing nitrogen as a raw material is excellent in terms of step coverage, its dielectric constant is high. A concrete example will be explained which reference to FIG. 2. An interlayer insulator 12 such as an $SiO_2$ layer or the like is formed on a semiconductor substrate 11 such as an Si substrate or the like. Next, first Al wirings 13,13' are formed by patterning on the interlayer insulator 12. Then, on the Al wirings 13,13', there is formed by plasma CVD methods an SiN layer 14 which thus covers the Al wirings 13,13'. Thereupon, second Al wiring 15 is formed by patterning on the SiN layer 14. Consequently, as illustrated in FIG. 2, a coupling capacitance $C_2$ is formed between the first wirings 13 and 13', and an interlayer capacitance $C_1$ is formed between the first wirings 13,13' and the second wiring 15.

If an SiN layer is used as an interlayer insulator, both the above coupling capacitance $C_2$ and the interlayer capacitance $C_1$ are large in their values due to the high dielectric constant of the layer. Therefore, delay in operation gets larger due to the large parasitic capacitances, i.e., it is difficult in this way to produce a semiconductor device which is fast in operation. Moreover, due to the larger parasitic capacitances, a semiconductor device having an SiN layer as an interlayer insulator consumes during its operation a larger amount of electric power. If such semiconductor devices are operated by cells or the like, operation time of the cells becomes shorter which is problematic.

OBJECTS AND SUMMARY OF THE INVENTION

A first object of the present invention is to provide a method of forming a fluorine-containing SiN layer excellent in the step coverage.

A second object of the present invention is to provide a method for making a semiconductor device that is characterized by having the least possible delay in operation due to reduced parasitic capacitances and also having the least possible power consumption.

The method for manufacturing a semiconductor device of the present invention comprises forming an SiN layer using an Si compound containing at least both nitrogen and fluorine as a starting raw material. Preferably, the nitrogen and flourine-containing Si compond is an organic Si compond.

Preferably the organic Si compound is a compound having at least one bond selected from the group consisting of Si—F bonds, Si—N—F bonds and Si—C—F bonds.

The organic Si compound also includes an Si—Si bond.

The manufacturing method of semiconductor device of the present invention is characterized in that, in the above-mentioned manufacturing method of semiconductor device, the SiN layer is formed by plasma CVD method using as gaseous raw material the nitrogen and fluorine-containing Si compound.

The manufacturing method of semiconductor device of the present invention is characterized in that, in the above-mentioned manufacturing method of semiconductor device, both adsorption of the gaseous raw material on a substrate on which the SiN layer is to be formed and plasma treatment are repeated by turns.

In the manufacturing method of semiconductor device of the present invention, a fluorine-containing SiN layer is formed using as raw material an organic Si compound containing both nitrogen and fluorine. An intermediate product which is formed during the formation of this fluorine-containing SiN layer, tends to polymerize and, has fluidity so that the fluorine-containing SiN layer thus formed provides execellent step coverage. Moreover, because the SiN layer thus formed contains fluorine, the dielectric constant of the fluorine-containing SiN layer is lowered and, delays in circuit operation due to parasitic capacitances can be reduced.

In the manufacturing method of semiconductor device of the present invention, fluorine is stably integrated in the fluorine-containing SiN layer, compared to a method using an organic Si compound containing an additive such as $C_2F_6$ or the like. Thus, the fluorine-containing SiN layer formed by the method of the present invention is less hygroscopic.

In the manufacturing method of semiconductor device of the present invention, the Si—Si bond is low in binding energy and easily dissociated; compared to a case where a raw material having Si—H bonds and the like is Accordingly, a large amount of precursors to a fluorine-containing SiN layer are produced so that the SiN layer 14 can be formed rapidly.

In the manufacturing method of semiconductor device of the present invention, there is employed plasma CVD method by which the formation of an SiN layer at lower temperature is feasible and no damages are inflicted on the existing Al wirings and the like.

In the manufacturing method of semiconductor device of the present invention, unreacted reactants in the gaseous raw material after the reaction can be easily removed compared to a case where the plasma treatment is carried out under a continuous supply of the gaseous raw material.

DETAILED DESCRIPTION OF THE PREFERRED EMBODIMENTS

In the following referring to FIGS. 3 and 4, there will be explained the first to sixth embodiments of the present invention which is applied to manufacturing a semiconductor device having as the passivation layer a fluorine-containing SiN layer.

The above fluorine-containing SiN layer is supposed to be of a mixed structure made up of the bonds Si—F, Si—N and Si—O. An insulator layer having this type of structure will hereinafter be simply called the SiN layer or the fluorine-containing SiN layer.

Prior to an explanation of the embodiments, there will be made an explanation of a parallel plate type plasma CVD apparatus that was used for forming the fluorine-containing SiN layer in the first to sixth embodiments. In this CVD apparatus as indicated in FIG. 3, out of the parallel plate electrodes located in the reaction chamber 21, the lower electrode 22, on which a semiconductor substrate 31 is placed and which is grounded, is heated by a heater 23.

Figure 3:
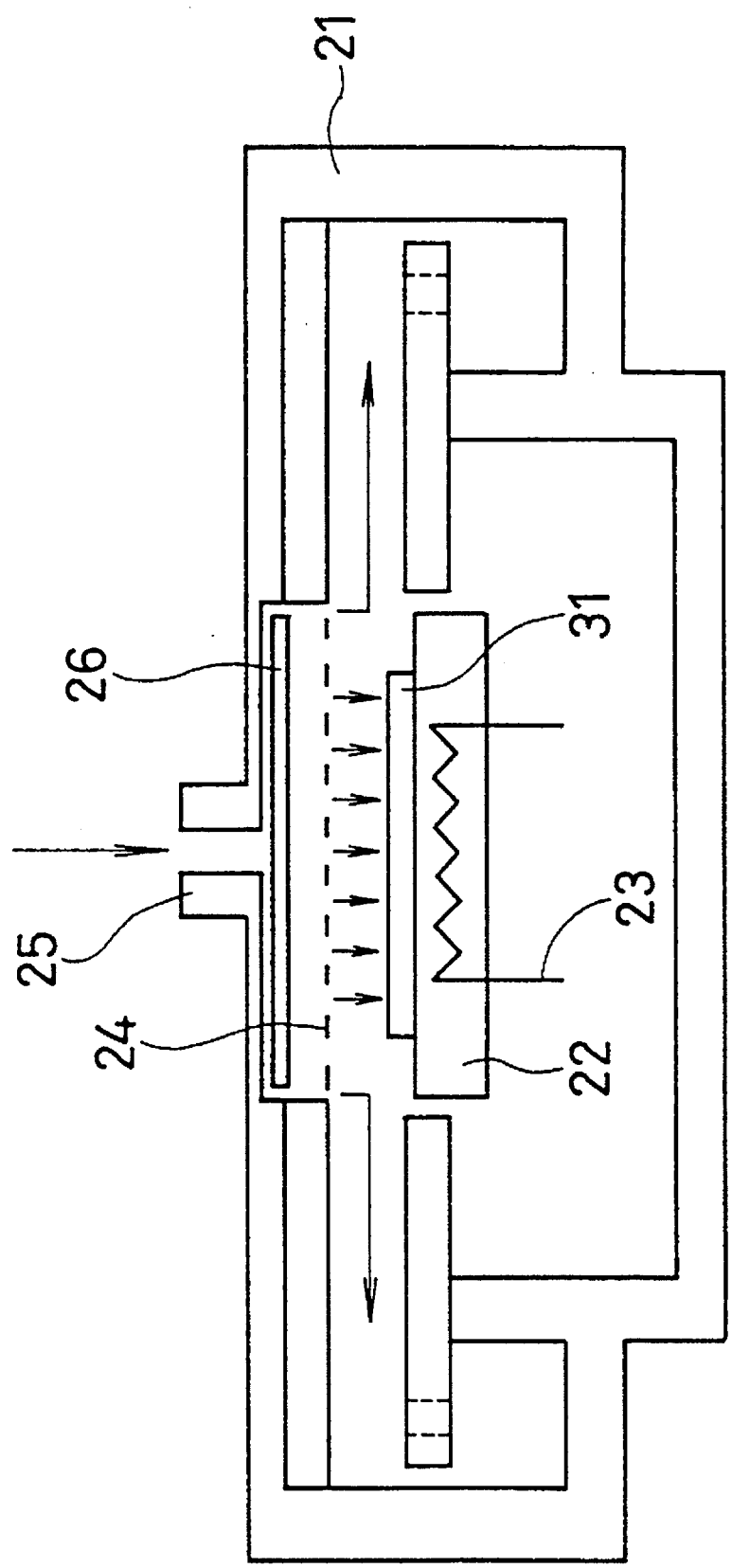
FIG. 3 is a concept representation of a CVD apparatus used in the first to sixth embodiments of the present invention.

On the other hand, the other electrode 24, to which a high frequency voltage is applied, is formed as a shower electrode; as indicated with an arrow in FIG. 3, a gas dispersing plate 26 is placed between the upper electrode 24 and a gas inlet pipe 25 in order to uniformly disperse in the reaction chamber 21 both a gaseous raw material to form the SiN layer and a plasma treatment gas.

Figure 1A:
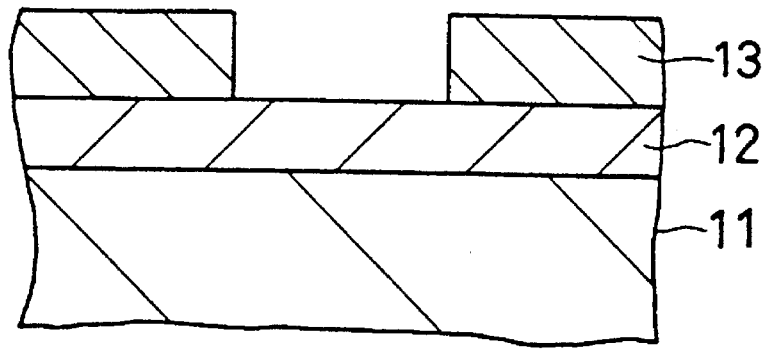
FIGS. 1A and 1B are sectional side views of a semiconductor device, showing one related art to the present invention in sequence of processing steps.
Figure 1B:
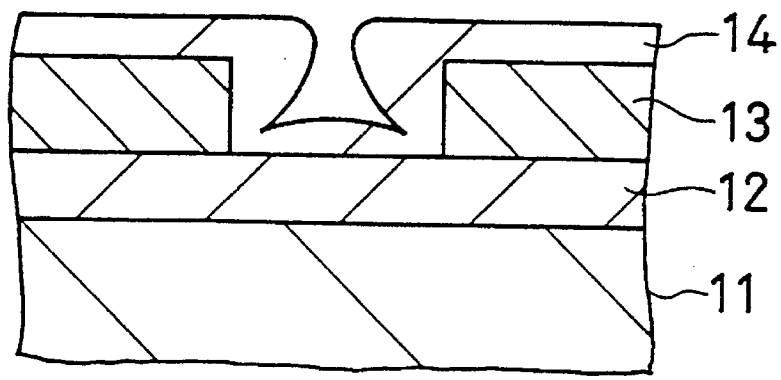
Figure 2:
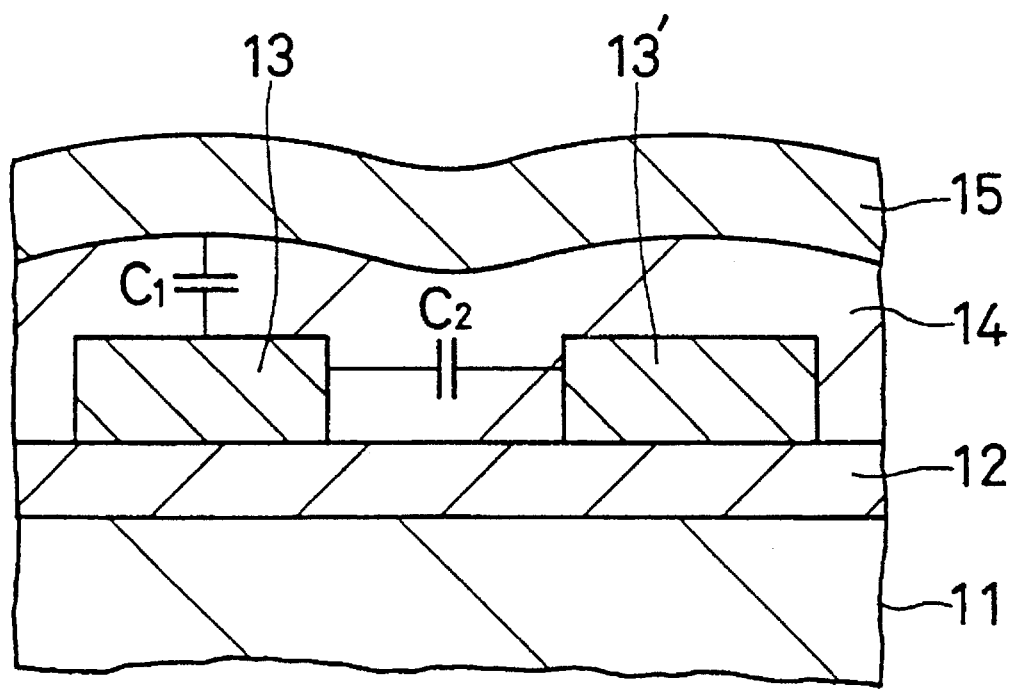
FIG. 2 is a sectional side view of a semiconductor device manufactured according to another related art to the present invention for explaining problematic points of that device.
Figure 4A:
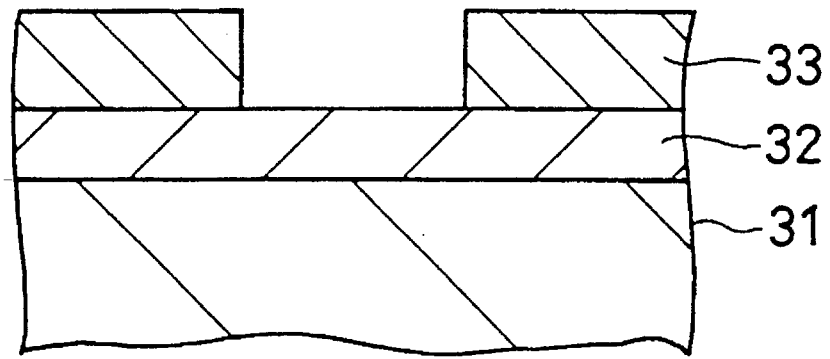
FIGS. 4A and 4B are sectional side views of a semiconductor device, showing the first to sixth embodiments of the present invention in sequence of processing steps.
Figure 4B:
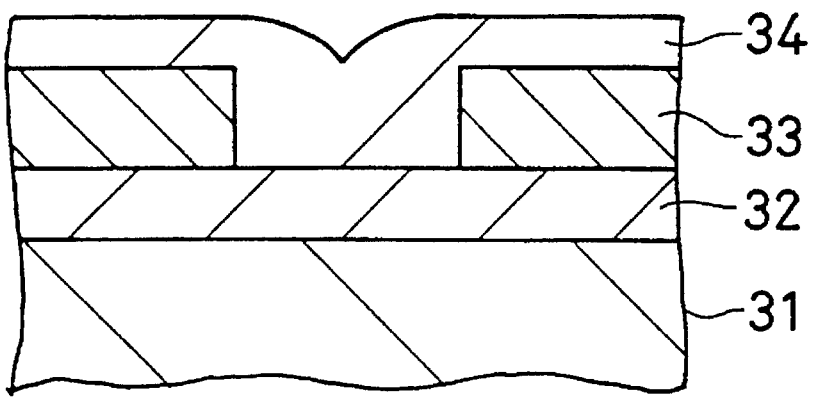

Next, the first embodiment will be explained. As shown in FIG. 4A, the first embodiment followed, up to the patterning of Al wirings 33, essentially the same processing steps as the related art shown in FIG. 1. Thereafter in the first embodiment, however, the SiN layer 34 as shown in FIG. 4B was formed using the CVD apparatus shown in FIG. 3 under the following condition:

| | |
|---|---|
| Flow rate of $[(CH_3)_2N]_2SiF_2$ gas | 100 sccm |
| Pressure | 1200 Pa |
| Temperature of the semiconductor substrate | 400° C. |
| Distance between the parallel plate electrodes | 10 mm |

Instead of the above gas, a gas having the general formula $[R_2N]_xSiF_{4-x}$ wherein R is hydrogen or an alkyl group and $1 \leq x \leq 3$ can also be used.

Thereafter, the SiN layer 34 was annealed in a forming gas whose $H_2$ concentration was reduced to 3% by dilution with $N_2$, under the following condition:

| | |
|---|---|
| Flow rate of the forming gas | 8 liters/minute |
| Annealing time | 60 minutes |
| Pressure | atmospheric pressure |
| Annealing temperature | 400° C. |

Corrosion tests were carried out in a hydrochloric acid solution under the following condition:

| | |
|---|---|
| Concentration of the hydrochloric acid solution | 5% |
| Test duration | 5 minutes |
| Temperature of the hydrochloric acid solution | 25° C. |

No corrosion of the Al wirings 33 was observed. This can be understood that the step portions of the Al wirings 33 were sufficiently covered by the SiN layer 34 as shown in FIG. 4B.

Next, the second embodiment will be explained. The second embodiment also followed essentially the same processing steps as in the above first embodiment except that the SiN layer 34 was formed under following condition (it is to be noted that, in order to regulate nitrogen content in the SiN layer 34, $NH_3$ was added to the gaseous raw material):

| | |
|---|---|
| Flow rate of $Si(NF_2)_4$ gas | 100 sccm |
| Flow rate of $NH_3$ gas | 100 sccm |
| Radio frequency power | 350 W |
| Pressure | 1200 Pa |
| Temperature of the semiconductor substrate | 200° C. |
| Distance between the parallel plate electrodes | 10 mm |

After the SiN layer 34 had been formed, corrosion tests were carried out under the same condition as in the first embodiment. No corrosion of the Al wirings 33 was observed in this second embodiment, too.

Next, the third embodiment will be explained. The third embodiment also followed essentially the same processing steps as in the above first embodiment except for the forming step of the SiN layer 34, i.e., in the third embodiment, both the adsorption of the gaseous raw material and the formation reaction of the SiN layer 34 by the plasma treatment were repeated ten times by turns under the following condition, respectively:

The adsorption of the gaseous raw material:

| | |
|---|---|
| Flow rate of Si[N(CF$_3$)$_2$]$_4$ gas | 100 sccm |
| Pressure | 1200 Pa |
| Temperature of the semiconductor substrate | 100° C. |
| Distance between the parallel plate electrodes | 10 mm |
| Adsorption time | 5 minutes |

Instead of the above gas, a gas having the general formula Si[N(C$_n$F$_{2n+1}$)$_2$]$_4$ wherein n is equal to or larger than 1 can also be used;

The plasma treatment:

| | |
|---|---|
| Flow rate of NH$_3$ gas | 50 sccm |
| Radio frequency power | 350 W |
| Pressure | 1200 Pa |
| Temperature of the semiconductor substrate | 400° C. |
| Distance between the parallel plate electrodes | 10 mm |
| Treatment duration | 5 minutes |

After the SiN layer 34 had been formed, corrosion tests were carried out under the same condition as in the first embodiment. No corrosion of the Al wirings 33 was observed in this third embodiment, too.

Next, the fourth embodiment will be explained. The fourth embodiment also followed essentially the same processing steps as in the above first embodiment except that the SiN layer 34 was formed under the following condition:

| | |
|---|---|
| Flow rate of [(CH$_3$)$_2$N]$_4$Si$_2$F$_2$ gas | 100 sccm |
| Pressure | 1200 Pa |
| Temperature of the semiconductor substrate | 400° C. |
| Distance between the parallel plate electrodes | 10 mm |

Instead of the above gas, a gas having the general formula [(R)$_2$N]$_x$Si$_2$F$_{6-x}$ wherein R is hydrogen or an alkyl group and $1 \leq x \leq 5$ can also be used. After the SiN layer 34 had been formed, corrosion tests were carried out under the same condition as in the first embodiment. No corrosion of the Al wirings 33 was observed in this fourth embodiment, too.

Next, the fifth embodiment will be explained. The fifth embodiment also followed essentially the same processing steps as in the above first embodiment except that the SiN layer 34 was formed under the following condition (it is to be noted that, in order to regulate nitrogen content in the SiN layer 34, NH$_3$ was added to the gaseous raw material):

| | |
|---|---|
| Flow rate of [(CH$_3$)$_2$N]Si$_2$(OC$_2$H$_5$)$_2$F$_2$ gas | 100 sccm |
| Flow rate of NH$_3$ gas | 50 sccm |
| Radio frequency power | 350 W |
| Pressure | 1200 Pa |
| Temperature of the semiconductor substrate | 200° C. |
| Distance between the parallel plate electrodes | 10 mm |

Instead of the above gas, a gas can also be used, having the general formula [(R)$_2$N]$_n$Si$_2$(OR)$_m$F$_r$ wherein R is hydrogen or an alkyl group and n+m+r=6, n,m,r being equal to or larger than 1, respectively. After the SiN layer 34 had been formed, corrosion tests were carried out under the same condition as in the first embodiment. No corrosion of the Al wirings 33 was observed in this fifth embodiment, too.

Next, the sixth embodiment will be explained. The sixth embodiment also followed essentially the same processing steps as in the above first embodiment except that the SiN layer 34 was formed under the following condition (it is to be noted that, in order to regulate nitrogen content in the SiN layer 34, N$_2$ was added to the gaseous raw material):

| | |
|---|---|
| Flow rate of (NF$_2$)$_6$Si$_2$ gas | 100 sccm |
| Flow rate of N$_2$ gas | 100 sccm |
| Radio frequency power | 350 W |
| Pressure | 1200 Pa |
| Temperature of the semiconductor substrate | 200° C. |
| Distance between the parallel plate electrodes | 10 mm |

After the SiN layer 34 had been formed, corrosion tests were carried out under the same condition as in the first embodiment. No corrosion of the Al wirings 33 was observed in this sixth embodiment, too.

Conclusively, by the manufacturing method of semiconductor device of the present invention, the SiN layer excellent in the step coverage can be formed so that a highly reliable semiconductor device can be manufactured. Moreover, as delay in circuit operation due to parasitic capacitances can be reduced, a semiconductor device fast in its operation can be manufactured.

By the manufacturing method of semiconductor device of the present invention, a less hygroscopic SiN layer can be formed compared to a method using an organic Si compound containing an additive such as C$_2$F$_6$ or the like. Thus, a still more reliable semiconductor device can be manufactured.

By the manufacturing method of semiconductor device of the present invention, the SiN layer can be formed rapidly, compared to a method using a raw material containing the Si—H bond or the like. Thus, semiconductor devices can be manufactured with larger throughput.

By the manufacturing method of semiconductor device of the present invention, no damages are inflicted on the existing Al wirings or the like. Thus, semiconductor devices can be manufactured with higher yield.

Further, by the manufacturing method of semiconductor device of the present invention, unreacted reactants in the gaseous raw material after the reaction can be easily removed compared to a method by which the plasma treatment is carried out under a continuous supply of the gaseous raw material. Thus, semiconductor devices can be manufactured with still higher yield.

What is claimed is:

1. A method for manufacturing a semiconductor device comprising the step of forming an SiN layer on a substrate using as a raw material an Si compound containing at least both nitrogen and fluorine.

2. A method as defined in claim 1, wherein said organic Si compound is a compound having at least one bond selected for the group consisting of Si—F bonds, Si—N—F bonds and Si—C—F bonds.

3. A method as defined in claim 1, wherein said Si compound is an organic Si compound having an Si—Si bond.

4. A method as defined in claim 1, wherein said SiN layer is formed by a plasma CVD method using as a gaseous raw material said Si compound.

5. A method as defined in claim 4, wherein in said plasma CVD method adsorption of said gaseous raw material on the substrate on which said SiN layer is to be formed and plasma treatment are repeated by turns.

6. A method as defined in claim 2, wherein the Si compound has the general formula (R$_2$N)$_x$SiF$_{4-x}$ wherein R is hydrogen or an alkyl group and $1 \leq x \leq 3$.

7. A method as defined in claim 2, wherein the Si compound is Si(NF$_2$)$_4$.

8. A method as defined in claim 2, wherein the Si compound has the general formula Si{N(C$_n$F$_{2n+1}$)$_2$}$_6$ wherein n is equal to or larger than 1.

9. A method as defined in claim 5, wherein NH$_3$ gas is supplied during said plasma treatment.

10. A method as defined in claim 2, wherein the Si compound has the general formulas $(R_2N)_xSi_2F_{6-x}$ wherein R is hydrogen or alkyl group and $1 \leq x \leq 5$.

11. A method as defined in claim 2, wherein the Si compound has the general formula $(R_2N)_nSi_2(OR)_mF_r$ wherein R is hydrogen or an alkyl group and n+m+r=6, n,m,r being equal to or larger than 1, respectively.

12. A method as defined in claim 2, wherein the Si compound is $(NF_2)_6Si_2$.

13. A method manufacturing a semiconductor device, comprising the step of forming an insulator layer having Si—F, Si—N, Si—O bonds of a substrate using as a raw material an Si compound containing at least both nitrogen and fluorine.

14. A method as defined in claim 13, wherein the Si compound is a compound having at least one bond selected from the group consisting of Si—F bonds, SI—N—F bonds and SI—C—F bonds.

15. A method as defined in claim 13, wherein the Si compound is an organic Si compound having an Si—Si bond.

16. A method as defined in claim 13, wherein the insulator layer is formed by a plasma CVD method using as gaseous raw material said Si compound.

17. A method as defined in claim 16, wherein in said plasma CVD method adsorption of said gaseous raw material on the substrate on which said insulator layer is to be formed and plasma treatment are repeated by turns.

18. A method as defined in claim 13 wherein the Si compound has the general formula $(R_2N)_xSiF_{4-x}$ wherein R is hydrogen or an alkyl group and $1 \leq x \leq 3$.

19. A method as defined in claim 13, wherein the Si compound is $Si(NF_2)_4$.

20. A method as defined in claim 13, wherein the Si compound has the general formula $Si\{N(C_nF_{2n+1})_2\}_4$ wherein n is equal to or larger than 1.

21. A method as defined in claim 17, wherein $NH_3$ gas is supplied during said plasma treatment.

22. A method as defined in claim 13, wherein the Si compound has the general formula $(R_2N)_nSi_2F6-n$ wherein R is hydrogen or an alkyl group and n is equal to or larger than 1.

23. A method as defined in claim 13, wherein the Si compound has the general formula $(R_2N)_nSi_2(OR)_mF_r$ wherein R is hydrogen or an alkyl group and n+m+r=6, n,m,r being equal to or larger than 1, respectively.

24. A method as defined in claim 13, wherein the Si compound is $(NF_2)_6Si_2$.

* * * * *